United States Patent [19]
Degani et al.

[11] Patent Number: 6,077,725
[45] Date of Patent: Jun. 20, 2000

[54] METHOD FOR ASSEMBLING MULTICHIP MODULES

[75] Inventors: Yinon Degani, Highland Park; Thomas Dixon Dudderar, Chatham; King Lien Tai, Berkeley Heights, all of N.J.

[73] Assignee: Lucent Technologies Inc, Murray Hill, N.J.

[21] Appl. No.: 07/940,157

[22] Filed: Sep. 3, 1992

[51] Int. Cl.⁷ .................................................. H01L 21/44
[52] U.S. Cl. ........................ 438/108; 438/107; 438/109; 438/118; 438/119
[58] Field of Search ............................... 148/24, 25, 228; 228/207, 223, 224, 248, 180, 22; 257/772, 777, 737, 738, 778, 779, 780; 437/183, 188; 438/107, 108, 109, 118, 119

[56] References Cited

U.S. PATENT DOCUMENTS

| | | | |
|---|---|---|---|
| 3,716,907 | 2/1973 | Anderson | 438/120 |
| 3,763,550 | 10/1973 | Oakes | 438/309 |
| 4,067,104 | 1/1978 | Tracy | 438/59 |
| 4,442,966 | 4/1984 | Jourdain et al. | 228/123 |
| 4,509,994 | 4/1985 | Barajas | 148/24 |
| 4,654,752 | 3/1987 | Kyle | 361/718 |
| 4,784,310 | 11/1988 | Metzger et al. | 228/123 |
| 4,840,924 | 6/1989 | Kimbara | 437/189 |
| 4,872,261 | 10/1989 | Sanyal et al. | 29/840 |
| 4,878,611 | 11/1989 | Lovasco et al. | 228/180.22 |
| 4,898,117 | 2/1990 | Ledermann et al. | 118/665 |
| 4,942,140 | 7/1990 | Ootsuki et al. | 438/124 |
| 4,960,236 | 10/1990 | Hedges et al. | 228/180.1 |
| 4,991,000 | 2/1991 | Bone et al. | 257/686 |
| 5,001,542 | 3/1991 | Tsukagoshi et al. | 257/746 |
| 5,009,724 | 4/1991 | Dodd et al. | 148/23 |
| 5,024,372 | 6/1991 | Altman et al. | 228/248 |
| 5,032,543 | 7/1991 | Black et al. | 438/107 |
| 5,041,169 | 8/1991 | Oddy et al. | 148/23 |
| 5,046,415 | 9/1991 | Oates | 101/128.21 |
| 5,071,359 | 12/1991 | Arnio et al. | 439/91 |
| 5,088,189 | 2/1992 | Brown | 29/840 |
| 5,109,320 | 4/1992 | Bourdelaise et al. | 361/785 |
| 5,120,665 | 6/1992 | Tsukagoshi et al. | 438/15 |
| 5,130,768 | 7/1992 | Wu et al. | 357/82 |
| 5,150,832 | 9/1992 | Degani et al. | 228/224 |
| 5,176,759 | 1/1993 | Taguchi | 148/24 |
| 5,196,371 | 3/1993 | Kulesza et al. | 438/119 |
| 5,223,033 | 6/1993 | King et al. | 106/285 |
| 5,245,750 | 9/1993 | Crumly et al. | 29/840 |
| 5,246,880 | 9/1993 | Reele et al. | 438/613 |
| 5,250,469 | 10/1993 | Tanaka et al. | 438/125 |
| 5,261,593 | 11/1993 | Casson et al. | 228/180.22 |
| 5,313,366 | 5/1994 | Gaudenzi et al. | 361/760 |
| 5,315,241 | 5/1994 | Ewars | 438/15 |
| 5,341,564 | 8/1994 | Akhauain et al. | 29/832 |

FOREIGN PATENT DOCUMENTS

| | | | |
|---|---|---|---|
| 0 200 363 | 11/1986 | European Pat. Off. | C08B 11/193 |
| 0 395 488 | 10/1990 | European Pat. Off. | H01L 21/60 |
| 0 469 848 | 2/1992 | European Pat. Off. | H05K 3/34 |
| 2 604 029 | 3/1988 | France | H01L 23/50 |

(List continued on next page.)

OTHER PUBLICATIONS

"High–Density, Low Temperature Solder Reflow Bonding of Silicon Chips to Plastic Substrates"; L.Kuhn et al., *IBM T.D.B.*, vol. 18, No. 10, 3–76, p.3477.
*Microelectronics Packaging Handbook*; New York, Van Nostrand Reinhold, 1989. pp. 827, 829, 369, 371, TK 7874.T824 1988.
"Motorola ready to enter multichip module market" by T. Costlow, *Electronic Engineering Times.* May 18, 1992. p. 4.
"Meeting Global MCM Manufacturing Challenges" by M.C. Tucker, Amoco Chemical Company, Chicago, Illinois, *Solid State Technology.* Jun. 1992, p. 101.

*Primary Examiner*—Olik Chaudhuri
*Assistant Examiner*—Alonzo Chambliss
*Attorney, Agent, or Firm*—Samuel R. Williamson

[57] ABSTRACT

A multichip module is assembled using flip-chip bonding technology, a stencil printable solder paste and standard surface mount equipment for interconnecting signaling input/output contact pads on devices within such multichip module.

23 Claims, 5 Drawing Sheets

FOREIGN PATENT DOCUMENTS

| | | | |
|---|---|---|---|
| 26 58 302 | 7/1977 | Germany | H01L 23/50 |
| 41 10 373 | 10/1991 | Germany | H05K 3/34 |
| 56-018454 | 2/1981 | Japan | H01L 27/01 |
| 58-102533 | 6/1983 | Japan . | |
| 59-111338 | 6/1984 | Japan . | |
| 60-7139 | 1/1985 | Japan . | |
| 60-046039 | 3/1985 | Japan | H01L 21/60 |
| 63-132795 | 6/1988 | Japan . | |
| 125429 | 1/1989 | Japan . | |
| 159944 | 3/1989 | Japan . | |
| 62-318805 | 6/1989 | Japan . | |
| 1273326 | 11/1989 | Japan . | |
| 0290529 | 3/1990 | Japan . | |
| 2133937 | 5/1990 | Japan . | |
| 2188936 | 7/1990 | Japan . | |
| 366139 | 3/1991 | Japan . | |
| 3222340 | 10/1991 | Japan . | |
| 3273655 | 12/1991 | Japan . | |
| 46841 | 1/1992 | Japan . | |
| WO-A-90 07792 | 7/1990 | WIPO | H01L 21/60 |

900

METHOD FOR ASSEMBLING MULTICHIP MODULES

BACKGROUND OF THE INVENTION

1. Field of the Invention

This invention relates to the assembly of multichip modules and, more particular, to the assembly of integrated circuit chips having an array of contact pads within such multichip module.

2. Description of the Prior Art

In recent years, new technologies which can provide high-density interconnections within and between integrated circuits and in other applications within electronic equipment have emerged. These technologies include the assembling of multichip modules which may contain several unpackaged integrated circuit (IC) chips mounted on a single substrate.

Various techniques for assembling unpackaged IC chips in a multichip module are available. These modules may be assembled by, for example, using either wire bonded connections, tape-automatic-bonded (TAB) connections, or solder flip-chip bonding, depending on the desired number and spacing of signal input-output (I/O) connections on both the chip and the substrate as well as permissible cost.

In a comparison of these three techniques, wire bonding is the most common chip-bonding technique. This technique has traditionally provided the maximum number of chip connections with the lowest cost per connection. A disadvantage of wire bonding is that inductance present in the wires used in connecting the chip to the substrate degrades the electrical performance of the circuitry in the multichip module. Also, since the I/O connections are perimeter connections on the chip and since the wires connect to the substrate on an area not occupied by the chips, wire bonding requires more area on the substrate than that required in flip-chip bonding. Finally, wire bonding requires each connection between the chip and the substrate to be made one at a time and, therefore, is time consuming to assemble.

TAB bonding permits higher density I/O connections over wire bonding. This technique, however, is more expensive than wire bonding. This is, in part, because TAB bonding requires special tooling for each different chip design. Also like wire bonding, TAB bonding similarly requires I/O perimeter connections and therefore more area on a substrate than flip-chip bonding. There is also undesirable parasitic inductance which imposes a penalty on electrical performance of the IC chip circuitry connected using this bonding technique.

Flip-chip bonding of a multichip module is achieved by providing an IC chip with either perimeter or area array, solder wettable metal pads which comprise the signal (I/O) terminals on the chip and a matching footprint of solder wettable pads on the substrate. Before assembly onto the substrate, either the chip, the substrate, or both typically undergo a processing step as shown in FIG. 1 wherein a solid solder bump 11 is deposited at each signal (I/O) terminal on an IC chip 12 or on both an IC chip 16 and a substrate 17. The chip 12 (or 16) is then turned upside down and placed in an aligned manner on top of a substrate 13 (or 17) such that the solder bumps align with the wettable metal pads 14, or such that a pair of solder bumps on the chip 16 and the substrate 17 align with each other. All connections are then made simultaneously by heating the solder bumps to a reflow temperature at which the solder flows and an electrically conductive joint between the contact pads on both the substrate and the IC chip is formed. Such a process is described by R. R. Tummala and E. J. Rymaszewski in *Microelectronics Packaging Handbook,* New York: Van Nostrand Reinhold, 1989, pp. 366–391.

Thus flip-chip bonding of IC chips used in multichip modules provides the advantage of requiring less area on a substrate and thereby facilitates high-density interconnections of the chips comprising the module. Since the interconnections are short, well controlled electrical characteristics are provided. High-speed signals are thus propagated in and through the module with minimum delay and distortion. Also since flip-chip bonding is a batch process, all interconnections are made quickly and simultaneously through a solder reflow step.

Despite having the described advantages, flip-chip bonding is generally viewed as the most expensive of the three bonding techniques. Hence, it has traditionally been used in assembling only those high performance products where cost is generally not the controlling factor. Chips that are wire-bonded or TABed have generally sufficed in the past for use in those standard and high volume products wherein cost is a consideration. In view of the need for additional functions to be provided in increasingly smaller packages, thus requiring increased sophistication in package technologies, it is desirable that flip-chip bonding be achievable at low cost This bonding technique then becomes suitable for high volume applications while retaining the indicated technological advantages.

SUMMARY OF THE INVENTION

In accordance with the invention, a multichip module, which includes a substrate having an array of signal input/output contact pads and an unpackaged device chip having a matching array of signal input/output contact pads, is flip-chip assembled using a stencil printable solder paste and standard surface mount equipment.

The flip-chip assembly is achieved, in accordance with the invention, through use of a solder paste which includes desirable reflow alignment, fluxing and printability characteristics. In preferred embodiments, the solder paste is selectively printed through openings in a stencil onto, for example, the contact pads of the substrate for forming a solder paste pattern. The device chips are flipped and the contact pads on the chips are positioned in opposed alignment and in contact with the solder paste pattern using standard surface mount equipment. The solder paste is then heated at a reflow temperature for forming solder joints between the contact pads on the substrate and the contact pads on the device chip.

BRIEF DESCRIPTION OF THE DRAWING

This invention and its mode of operation will be more clearly understood from the following detailed description when read with the appended drawing in which.

Throughout the drawings, the same element when shown in more than one FIG. is designated by the same reference numeral.

DETAILED DESCRIPTION

In accordance with the invention, a multichip module is assembled using flip-chip bonding technology, a stencil printable solder paste and standard surface mount equipment for interconnecting signaling input/output contact pads on unpackaged devices within such multichip module. The flip chip bonding assembly process is simplified and achieved at low cost, in preferred embodiments, by use of a solder paste which includes desirable reflow alignment, fluxing and printability characteristics. These desirable characteristics allow the assembly process to be further economically achieved by permitting the use of standard surface mount equipment in the process.

Conventional flip-chip bonding techniques, such as the Controlled Collapsed Chip Connection (C4) process described by R. R. Tummala and E. J. Rymaszewski in *Microelectronics Packaging Handbook,* New York: Van Nostrand Reinhold, 1989, and other similar processes, provide a mature, albeit expensive, technology for the assembly of multichip modules for the following reasons. First, the application of solder either in the forms of 1) preform, 2) by evaporation (i.e. through a shadow mask or through a liftoff process) or 3) plating is expensive compared with other forms of printing such as, for example, stencil printing. Second, in each of the currently available flip-chip bonding techniques, either the IC chip or the substrate is subsequently solder reflowed prior to assembly. This necessitates an additional solder reflow step in joining the chips to the substrate as a part of the assembly process.

Figure 1:
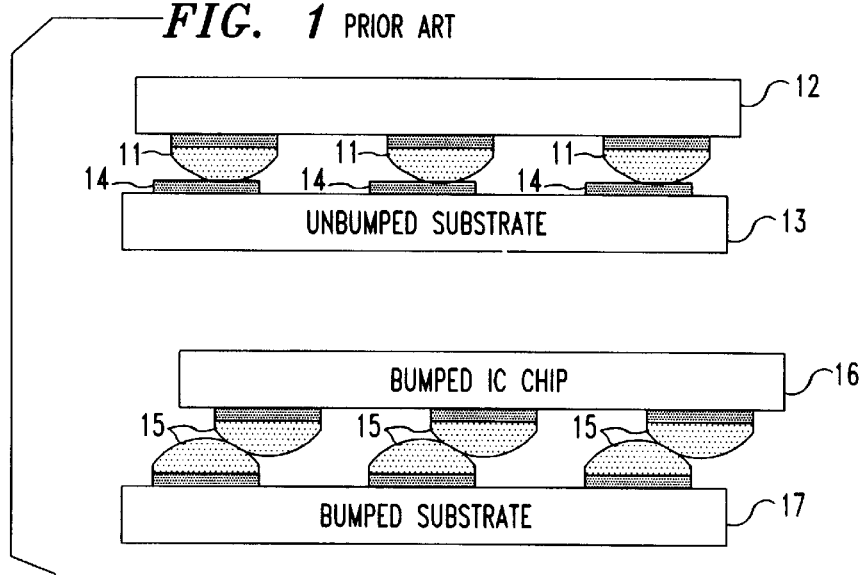
FIG. 1 is an illustration of two types of conventional flip-chip bonding assemblies available in the prior art.

The flip-chip assembly, which may have solder bumps on either the chips or the substrate or both the chips and the substrate, as show in FIG. 1, may be assembled in two principal ways each of which has limitations when compared to other assembly processes such as a micro surface mount assembly process disclosed later herein, in accordance with the invention. In a first flip chip assembly process, some practitioners apply a tacky flux to each placement site on a given substrate prior to assembly, and then place the appropriate chip at each site. Subsequent reflow then provides the assembled module. The drawbacks of this approach lie in the need to use the tacky flux and to apply it site by site which requires additional assembly steps, equipment and time. The second assembly process involves the use of thermocompression bonding between the chips and the substrate followed by subsequent fluxing and reflow either at the chip level, the substrate level, or the full wafer level. This approach is considerably slower than the micro surface mount process disclosed herein in that it requires the additional step for fluxing. In both conventional flip-chip assembly processes, the associated assembly equipment is generally expensive because of its limited breadth of applicability both within the industry and the technology. This equipment also tends to be relatively slow and inefficient when compared with surface mount assembly equipment.

In accordance with the invention, surface mount technology (SMT) is employed in assembling the multichip modules. SMT is an automated technology developed to speed the attachment of packaged ICs and discrete components (resistors, capacitors, diodes and transistors) to printed wiring boards (PWBs) using stencil printed solder paste and reflow soldering to assemble these components into hybrid circuit packs. SMT is known to provide a number of advantages when making an interconnection between an IC surface mount package and a circuit board. The packages for SMT can be developed with pads or connections extending out of the package at the tightest spacings, thus allowing more I/O interconnections per unit area of the package. Secondly, the technology can be used to increase the packaging density by requiring less board area and, therefore, lowering the cost of packaging the overall system.

Conventional surface mount experience suggests, however, that the approach of printing solder paste in placement applications gives rise to a formidable problem of defects such as, for example, solder balls and/or bridges between I/O contact pads. By way of example in illustrating the magnitude of the problem, in the process of multichip module assembly, as is provided herein in accordance with the invention, the density of connections are 20 times greater than they are in conventional surface mount technology. Consequently, there are 20 times the opportunity for solder balls and/or bridges to be formed and, accordingly, for these defects to create problems, i.e., current leakage paths.

When considering this problem from another perspective, in the process disclosed herein, there may be easily 2500 interconnections made in the assembly of a multichip module whereas in the surface mount assembly of a packaged IC onto a PWB package, there are typically 100 interconnections made. There is, therefore, a far higher potential risk of errors in the assembly of a multichip module. Moreover, in view of the nature of the flip-chip architecture, the opportunity for visual inspection and cleaning of observed defects is virtually eliminated. Still further, the issues of flux and paste residues as a contaminant and/or their cleanability are much more difficult to control in a flip-chip architecture than in the physically much larger and clearly much more open architecture associated with the assembly of hybrid circuit packs using conventional surface mount technology.

Empirical results obtained in support of the micro surface mount assembly process described herein have demonstrated a wide processing window for successfully suppressing defects such as solder balls and/or bridges. An important observation obtained from those results was that stencil printing of solder paste must be properly controlled in order to apply the correct amount of this paste. To achieve optimal stencil printing, the ratio between the stencil opening and the stencil thickness should be, preferably $\geq 2.5$. For example, with a 7.5 mil stencil opening the stencil thickness should be $\leq 3$ mil. Stencil openings between 5–15 mil in diameter can be printed. Using a stencil of 1–7 mil thickness, this allows a solder paste deposit of between 1–8 mil thickness suitable for printing on 4 to 15 mil diameter contact pads. For example, printing a solder paste through a 9 mil diameter stencil opening over a 6 mil diameter solder wettable pad, a solder deposit of 2.5–3.5 mil may be achieved 1) by optimizing the solder paste as described in U.S. Pat. No. 5,150,832, issued on Sep. 29, 1992, this application being commonly assigned with this present application to the same assignee and is incorporated herein by reference, and 2) by using a stencil having an optimum thickness of, for example, 2.5–3 mil. Once optimization of these factors are achieved, further observations also showed that conventional surface mount assembly equipment is able to be satisfactorily employed in the assembly of the multichip modules. A standard pick-and-place machine for surface mount assembly, such as the Fuji IP-II, will provide the necessary accuracy to assure that, after solder reflow, a high yield multichip module product will be available free of bridges and solder balls.

Figure 2:
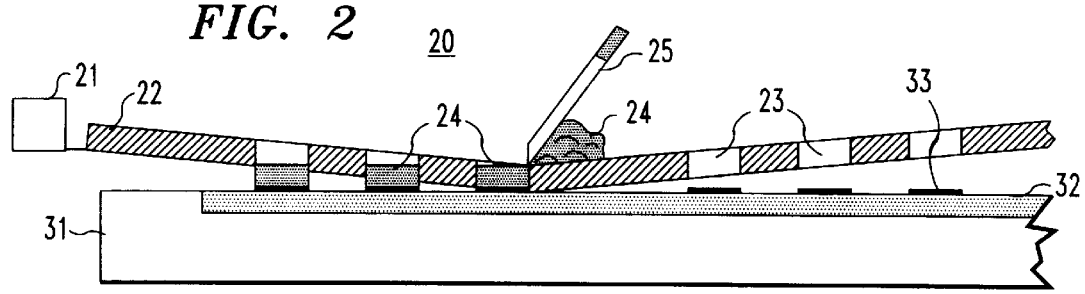
FIG. 2 shows a stencil printer suitable for depositing solder paste on patterned substrate wafers, in accordance with the invention.

Referring now to FIG. 2, there is shown a stencil printer 20 suitable for depositing solder paste on pre-patterned substrate wafers, in accordance with the invention. The stencil printer 20 comprises a perimeter stencil frame 21 surrounding and supporting a stencil 22 attached to this stencil frame 21. The stencil 22 has openings 23 for depositing solder paste 24. The stencil printer 20 also includes a solder depositing apparatus such as a squeegee blade 25 for spreading the solder paste 24 across the stencil 22 and into the stencil openings 23.

Also shown in FIG. 2 is a pallet 31 having a circular cavity for receiving a patterned substrate wafer 32. The solder paste, which is spread into the stencil openings 23 by the squeegee blade 25, is deposited onto solder wettable metal pads 33 on the top of the patterned substrate wafer 32. The patterned substrates contained on wafer 32, like the ICs they interface, will also include any desired active and passive circuits. The solder wettable metal pads 33 provide the necessary interconnections between the IC chips and are configured in arrays which match those on the IC chips.

In operation, the patterned substrate wafer 32 is positioned such that the solder wettable metal pads 33 are aligned with the stencil openings 23 in the stencil 22. The solder paste, described in detail later herein, is dispensed on the edge of the stencil and then pushed along the surface of the stencil by, for example, the squeegee blade 25 or some other solder paste depositing apparatus. By this process, solder paste is selectively deposited onto the wettable metal pads 33 on the patterned substrate wafer 32.

Figure 3:
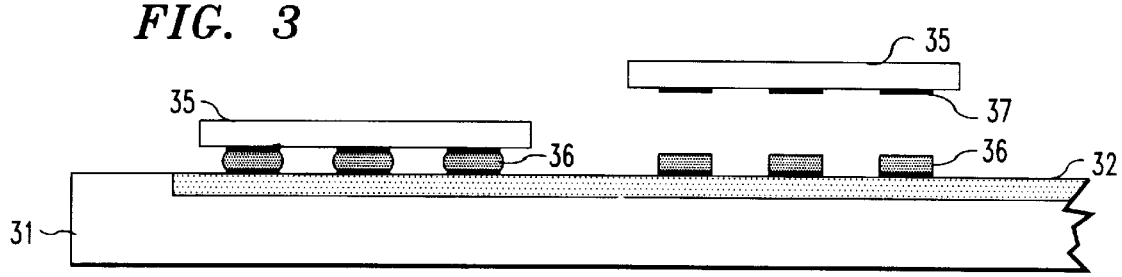
FIGS. 3 and 4 show a process for positioning device chips on unreflowed solder paste patterns for providing desired interconnections, in accordance with the invention.
Figure 4:
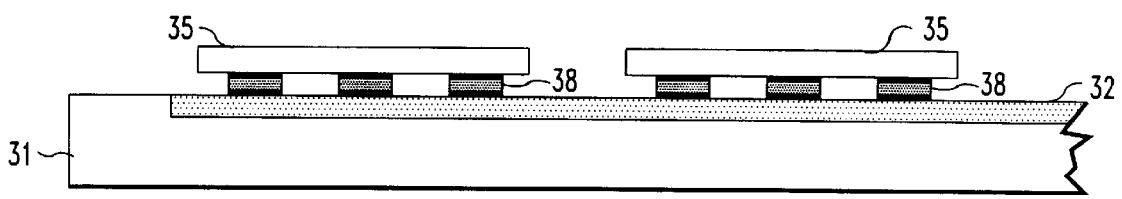

Referring next to FIGS. 3 and 4, also with FIG. 2, there is shown the process for positioning device chips on the unreflowed solder paste patterns 36 for providing the desired interconnections. These device chips may include, by way of example, IC chips 35, as illustrated, or also discrete component ensemble chips. An IC chip is an integrated circuit chip and a discrete ensemble chip is, singularly or in combination, a group of functionally discrete resistors, capacitors, transistors, and/or diodes fabricated on a single silicon substrate. Each IC chip 35 has solder wettable metal pads 37 which comprise the signal I/O terminals on these chips. In the operation of the process, the solder wettable metal pads 37 on each of the chips 35 are aligned over and placed onto matching solder paste patterns 36 on the substrate wafer 32 with conventional surface mount assembly equipment. The interconnections are then reflow soldered to form solder joints 38 shown in FIG. 4. In executing this process, the assemblies are passed through a reflow furnace (not shown) where they are heated to the point where the solder melts and forms the solder joints 38 between the solder wettable metal pads 37 on the chips 35 and the solder wettable metal pads 33 on the substrate 32.

Figure 5:
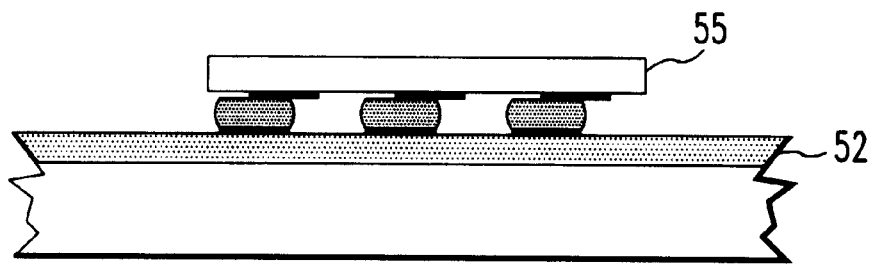
FIGS. 5, 6, and 7 illustrate the steps of surface tension driven reflow alignment, which occurs during a reflow soldering process.
Figure 6:
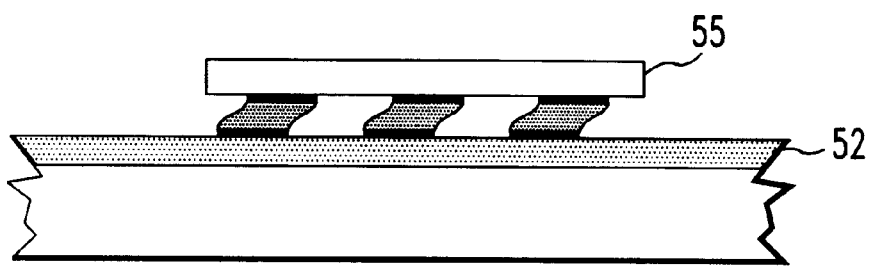
Figure 7:
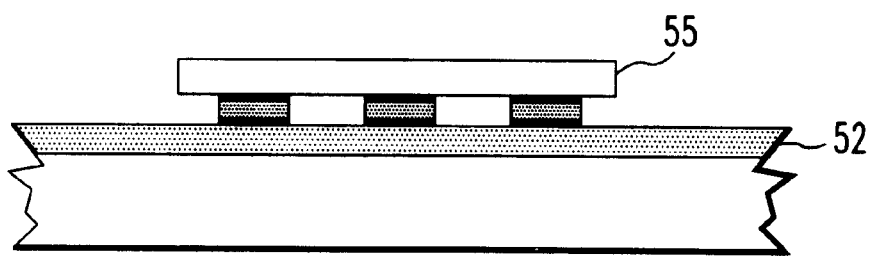

Referring next to FIGS. 5, 6 and 7, in combination, there is shown an illustration of the process of surface tension driven reflow alignment. Conventional surface mount assembly equipment aligns with and places a chip 55 onto its matching pattern on a substrate wafer 52 typically with an accuracy of within ±2 mils. This accuracy for rerouted patterns of 6 mil wettable metal pads having 8 mil separations is sufficient to insure good yield upon reflow soldering by virtue of the surface tension driven reflow realignment. If the IC chip 55 is offset up to ±2 mils, for example, then the chip 55 and substrate 52 would appear mated generally as illustrated in FIG. 5. With reflow soldering, the solder paste melts and forms solder joints as illustrated in FIG. 6. With the surface tension driven reflow alignment, which occurs during the reflow process, the IC chip is then drawn into alignment with the substrate, as illustrated in FIG. 7.

The effectiveness of this process of reflow realignment is affected by the characteristics of the solder paste. Such solder paste must be designed not only to optimize reflow realignment, but at the same time provide the necessary fluxing characteristics. As earlier indicated herein, such a solder paste can be made by following the guidelines given in copending U.S. application Ser. No. 07/724,561. The solder paste and process for soldering described in this copending application is disclosed as being suitable for use in regular surface mount applications. With modifications, this solder paste and process for soldering is also suitable for use in micro surface mount applications, in accordance with the invention.

The solder paste employed in this soldering process contains solder balls of relatively small dimensions, i.e., balls having a diameter in the range 5 $\mu$m to 100 $\mu$m, and a vehicle i.e., flux. The solder balls are used to insure the presence of sufficient electrical conductance to produce a low resistance joint between the solder wettable metal pads on an IC chip and the solder wettable metal pads on a substrate. The flux is employed to yield a variety of properties necessary for the soldering process. In particular, the flux is chosen so that it is possible to print the paste onto the solder wettable metal pads of the substrate through a stencil without depositing essentially any paste in other regions of the substrate. The paste is also chosen 1) to have good tackiness so that when the IC chip is pressed onto the paste, it remains in position, 2) to remove metal oxides from the solder balls and contacting metal pads, and 3) so that at the reflow temperature any IC chip that is not precisely aligned with the substrate is able to move into alignment through the surface tension interactions. The flux additionally slows reoxidation during reflow by limiting oxygen from reaching the solder surface by diffusion through the flux.

In addition to the other requirements placed on the solder flux vehicle, it is essential that after reflow, any residue which remains either produces no harmful/corroding residue or yields a residue that is freely soluble in a cleaning solvent. The desirable properties of a flux vehicle together with the absence of a residue or the presence of an easy to clean residue in a non-corroding medium is possible by a specific choice of components. In particular, the flux components are chosen to include a metal oxide removing agent such as an organic acid, a low vapor pressure component that evaporates before reflow but that solvates or dissolves in the other components, a Theological modifier that provides the viscosity required for suitable printing properties and a high temperature component that evaporates slowly at the reflow temperatures of the solder used in the assembly.

By way of example, and in accordance with the principles disclosed in U.S. Pat. No. 5,150,832, issued on Sep. 29, 1992, a flux was made by mixing 6 grams diphenic acid, 24 grams propyl-4-hydroxy benzoate, 5 grams ethyl cellulose, 2 grams castor oil, 10 grams rosin gum and 53 grams of poly-propylene glycol molecular weight, preferably ≧425 grams/mole. The temperature of the mixture was allowed to rise to 135° C. so that all ingredients were fully dissolved. The flux was then cooled to room temperature. Next 12.0 grams of the flux were mixed with 87.5 grams of solder powder of the composition tin (95%) and antimony (5%), the solder powder having powder size −500 mesh to provide an adequate amount of solder paste for forming acceptable micro interconnections directly between flipped unpackaged IC chips and appropriately metallized and patterned substrates.

Figure 8:
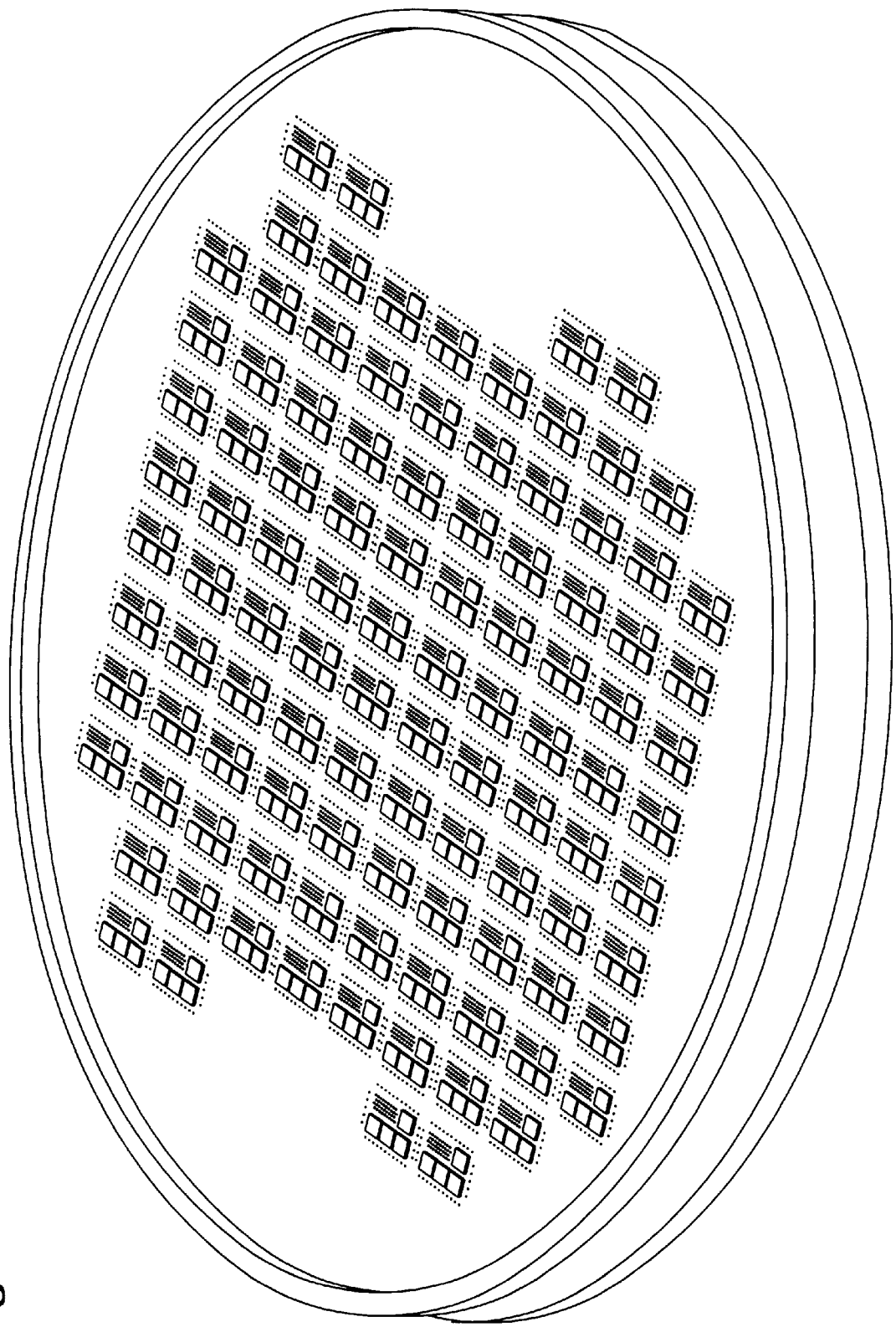
FIG. 8 is an illustration of a patterned substrate wafer populated with device chips.

FIG. 8 is an illustration of a patterned substrate wafer populated with IC chips. On each one of the plurality of the patterned substrates illustrated, four of the five IC chips have been placed on each patterned substrate using conventional surface mount assembly equipment. The solder wettable metal surfaces or pads for the fifth IC chip for each substrate are also illustrated in this FIG.

IC chips of any design may advantageously be provided with an additional metalization layer which reroutes the I/O contacts from a perimeter array configuration as commonly encountered on chips designed for wire bonding and TAB to I/O contacts of an area array. Such an area array configuration is advantageously constructed of a greater pitch and is therefore suitable for stencil printing of solder paste onto the wettable metal pads on either the chips or substrate.

Figure 9:
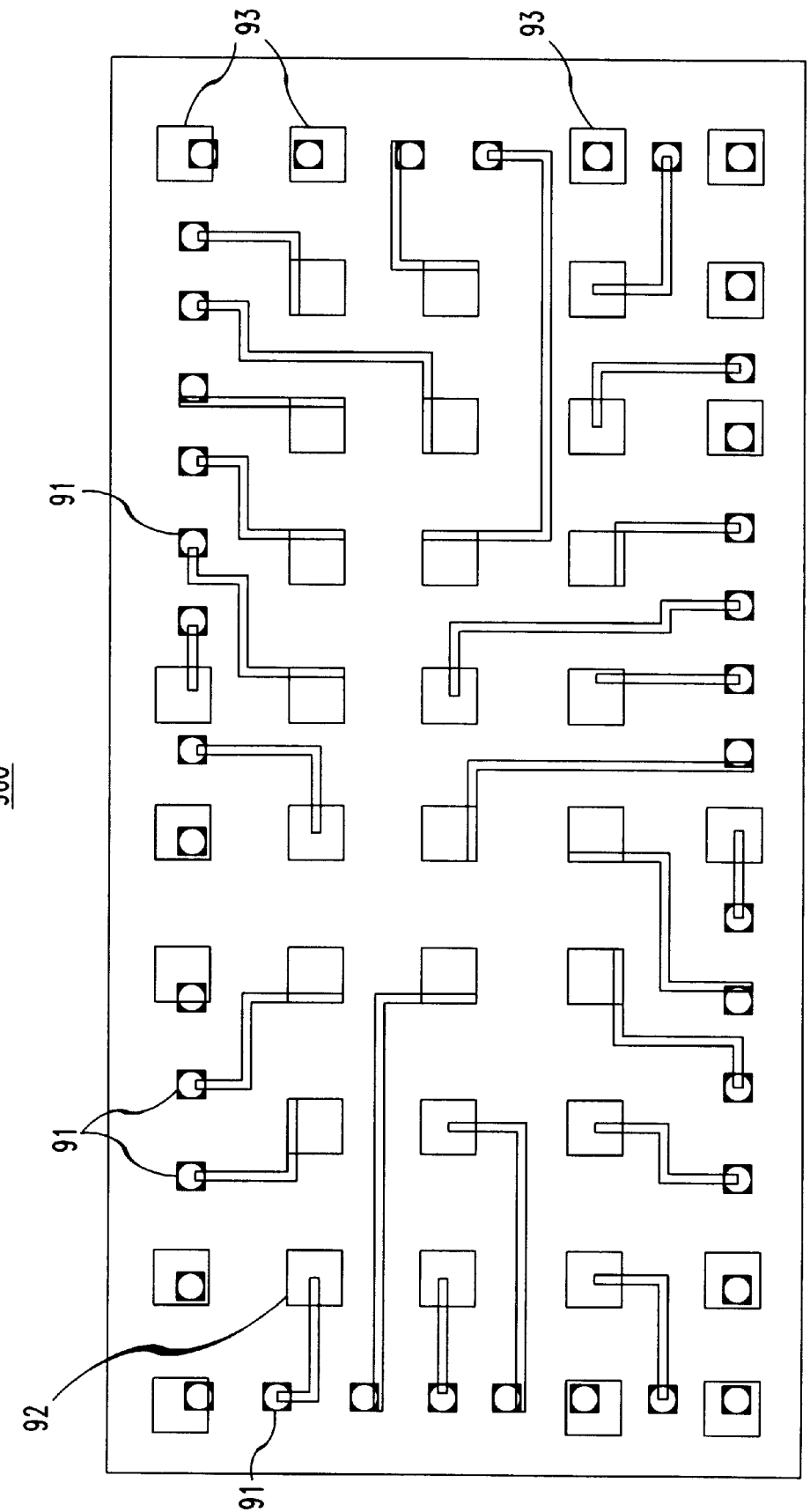
FIG. 9 illustrates an arrangement for rerouting of signal input-output contacts on a conventional device chip from a perimeter array to an area array of signal input-output contacts by providing an additional metalization layer.

Referring next to FIG. 9, there is shown the rerouting of I/O contacts on a conventional IC chip 90 from a perimeter array to an area array of I/O contacts by providing an additional metalization layer. The perimeter contacts 91 are contacts that have been rerouted into one of the area contacts 92. The perimeter contacts 93 are those contacts which are maintained on the perimeter of the chip in the additional metalization layer and serve as part of the area array of I/O contacts. Rerouting gives the following advantages: First, it permits use of conventionally designed chips—even commodity chips—in a multichip module. The requirement to develop custom chips with the desired I/O array contacts normally required for printing is thereby eliminated. Secondly, the ability to perform such rerouting facilitates the design of standard I/O patterns which may be developed for CAD/CAM databases. These standard I/O patterns may be considered somewhat analogous to the standardized sockets developed for vacuum tubes in the vacuum tube era, for example. Thirdly, the wider spacing of the rerouted solder wettable pads greatly improves the processing window for printing solder paste and reflow soldering. In some ICs having low density I/O contacts, however, it may not be necessary to reroute from a perimeter array to an area array. Rather, a perimeter array of well spaced solder wettable metal pads may suffice.

Figure 10:
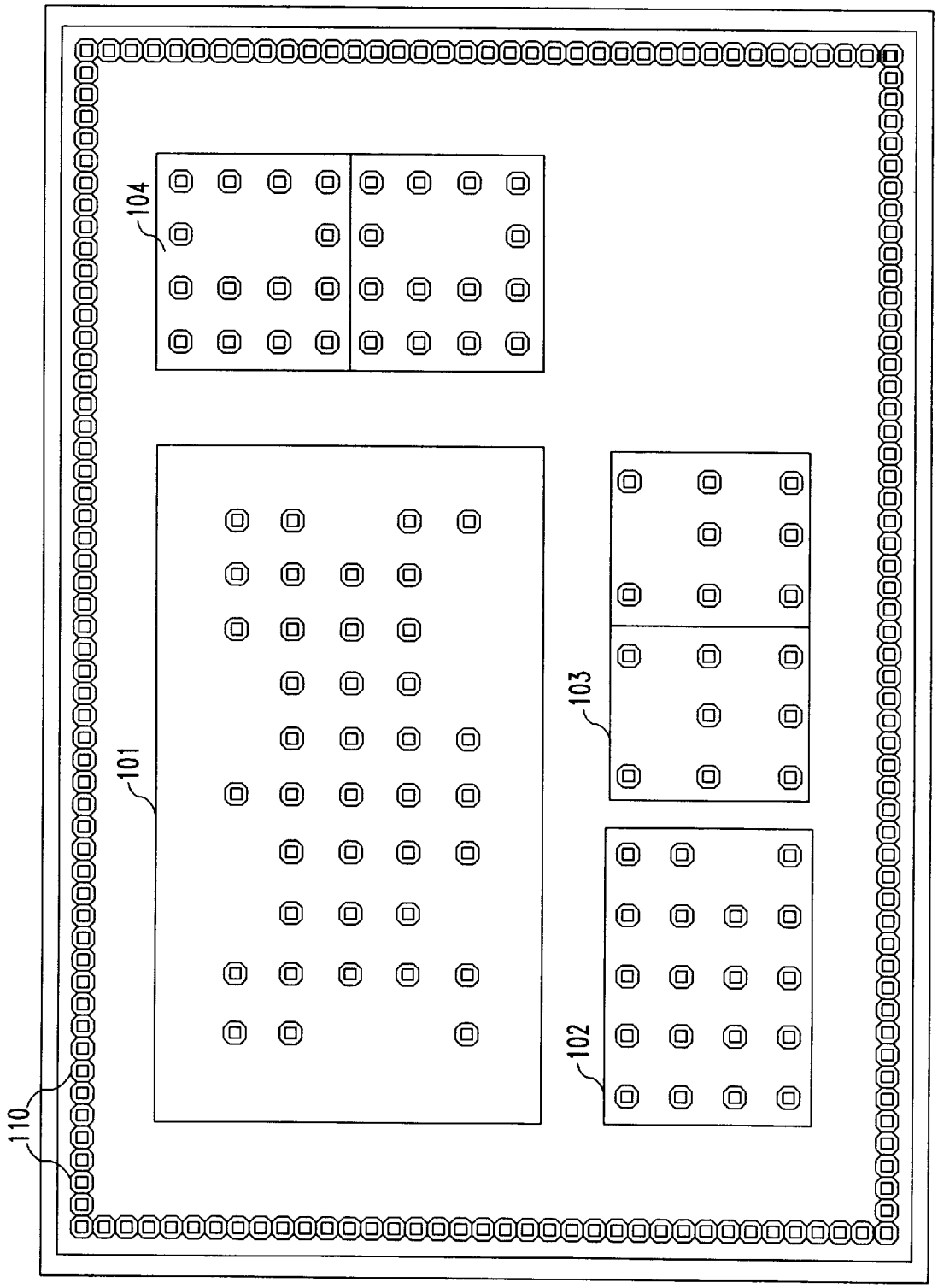
FIG. 10 shows a patterned substrate for a multichip module.

Shown in FIG. 10, is a patterned substrate for a multichip module. This module contains solder wettable metal pads on four patterns 101 through 104 for placing matching IC chips. Pattern 101, for example, accommodates the chip 90 shown in FIG. 9. Also, patterns 103 and 104 may be two unseparated IC chips. Not separating chips may be advantageous when the level of functionality desired in the multichip module is such that two of the same type of chip are required. Also shown are the perimeter array contacts 110 for providing I/O signals to, for example, a circuit board or for packaging of the multichip module.

Various modifications of this invention are contemplated. An example of such a modification is illustrated in the process whereby the solder paste is printed on the solder wettable metal pads of each IC chip and the solder paste patterns, generated thereby, are aligned with and placed in contact with the solder wettable metal pads on the substrate. The solder paste is subsequently reflowed to form solder joints between the contact pads on the IC chip and those on the substrate, as described earlier herein.

Another modification of the invention would be to print the solder paste patterns directly onto the IC chips while these chips are still in a whole wafer form (undiced) and then reflowing the wafer to form solder bumps. The wafer may subsequently be tested and diced or separated into the individual IC chips and eventually assembled into the multichip modules by placement into the stencil paste on the substrate wafer as described earlier herein. IC chips that have solder bumps obtained through this process provide an economical means for increasing the volume of solder in each joint, which may be desirable for reliable operation in some harsh conditions. The substrate may also be reflowed to form solder bumps through this process, if desired. Thus modifications may obviously be resorted to by those skilled in the art without departing from the spirit and scope of the invention as hereinafter defined by the appended claims.

What is claimed is:

1. A method of assembling a multichip module having an array of high density contact pads on a silicon substrate and a matching array of contact pads on an integrated circuit chip, the method comprising the steps of:

printing with automated surface mount equipment a solder paste selectively onto the contact pads of the substrate to form a solder paste pattern, the solder paste comprising a solder, a removing agent for metal oxides, a low temperature component that substantially evaporates below or at a reflow temperature but does not substantially evaporate at room temperature, a high temperature component that evaporates slowly at the reflow temperature, and a rheological modifier that allows said printing;

positioning said integrated circuit chip with said automated surface mount equipment, in said positioning step, the contact pads on the integrated circuit chip being positioned in opposed alignment and in contact with the solder paste that forms the solder paste pattern; and heating with said surface mount equipment the solder paste at a reflow temperature to form solder joints between the contact pads on the substrate and the contact pads on the integrated circuit chip.

2. The method of claim 1 wherein the printing step employs a patterned stencil having openings for printing the patterned solder paste onto the contact pads of the substrate.

3. The method of claim 2 wherein the openings in the stencil are between 5 and 15 mils in diameter.

4. The method of claim 3 wherein the stencil comprises between a 1 to 7 mil thickness sheet for printing on an area array of 4 to 15 mil contact pads.

5. The method of claim 4 wherein the solder paste is printed onto the contact pads of the substrate in a layer having a thickness of between 1 and 8 mils.

6. The method of claim 1 wherein the array of high density contact pads on the substrate and the matching array of contact pads on the device are configured as area arrays.

7. The method of claim 6 further including the step of rerouting the contact pads on the integrated circuit chip from a perimeter array to an area array when the array of contact pads on said integrated circuit is configured in a perimeter array.

8. The method of claim 7 further including surface mount equipment for positioning in opposed alignment and in contact with the contact pads on the integrated circuit and the solder paste pattern.

9. The method of claim 1 wherein said removing agent comprises diphenic acid.

10. The method of claim 1 wherein said low temperature component comprises propyl-4-hydroxybenzoate.

11. The method of claim 1 wherein said high temperature component comprises poly propylene glycol of average molecular weight ≧425 grams/mole.

12. The method of claim 1 wherein said rheological modifier component comprises ethyl cellulose.

13. The method of claim 1 wherein said solder comprises a tin/antimony alloy.

14. The method of claim 1 wherein said solder paste includes a flux mixture consisting of diphenic acid, propyl-4-hydroxy benzoate, ethyl cellulose, castor oil, rosin gum and poly-propylene glycol.

15. The method of claim 14 wherein the flux mixture is combined of approximately 6 weight % of diphenic acid, 24 weight % of propyl-4-hydroxy benzoate, 5 weight % of ethyl cellulose, 2 weight % of castor oil, 10 weight % of rosin gum and 53 weight % of poly-propylene glycol.

16. The method of claim 15 wherein said solder paste includes a solder powder consisting of tin and antimony.

17. The method of claim 16 wherein the solder powder is combined in proportions of 95% tin and 5% antimony.

18. The method of claim 17 wherein the solder powder has a powder size of −500 mesh.

19. The method of claim 18 wherein the flux mixture and solder powder are combined of 12.5 weight % of flux mixture and 87.5 weight % of solder powder.

20. A method of assembling a multichip module having an array of high density contact pads on a silicon substrate and a matching array of contact pads on an integrated circuit chip, the method comprising the steps of:

printing with automated surface mount equipment a solder paste selectively onto the contact pads of the substrate to form a solder paste pattern, the solder paste comprising a solder, a removing agent for metal oxides, a low temperature component that substantially evaporates below or at said reflow temperature but does not substantially evaporate at room temperature, a high temperature component that evaporates slowly at the reflow temperature, and a rheological modifier that allows said printing;

positioning said integrated circuit chip with said automated surface mount equipment, in said positioning step, the contact pads on the integrated circuit chip being positioned in opposed alignment and in contact with the solder paste that forms the solder paste pattern; and heating with said surface mount equipment the solder paste at a reflow temperature to form solder joints between the contact pads on the substrate and the contact pads on the integrated circuit chip; and wherein the solder paste comprises a flux mixture consisting of diphenic acid, propyl-4-hydroxy benzoate, ethyl cellulose, castor oil, rosin gum and poly-propylene glycol and a solder powder consisting of tin and antimony, and the flux mixture is combined of approximately 6 weight % of diphenic acid, 24 weight % of propyl-4-hydroxy benzoate, 5 weight % of ethyl cellulose, 2 weight % of castor oil, 10 weight % of rosin gum and 53 weight % of poly-propylene glycol.

21. A method of assembling a multichip module having an array of high density contact pads on a silicon substrate and a matching array of contact pads on a discrete component ensemble chip, the method comprising in order the steps of:

printing with automated surface mount equipment a solder paste selectively onto the contact pads of the substrate to form a solder paste pattern, the solder paste comprising a solder, a removing agent for metal oxides, a low temperature component that substantially evaporates below or at said reflow temperature but does not substantially evaporate at room temperature, a high temperature component that evaporates slowly at the reflow temperature, and a rheological modifier that allows said printing;

positioning said discrete component ensemble chip with said automated surface mount equipment, in said positioning step, the contact pads on the discrete component ensemble chip being positioned in opposed alignment and in contact with the solder paste that forms the solder paste pattern; and heating with said surface mount equipment the solder paste at a reflow temperature to form solder joints between the contact pads on the substrate and the contact pads on the discrete component ensemble chip.

22. The method of claim 21 wherein said solder paste includes a flux mixture consisting of diphenic acid, propyl-4-hydroxy benzoate, ethyl cellulose, castor oil, rosin gum and poly-propylene glycol.

23. The method of claim 22 wherein the flux mixture is combined of approximately 6 weight % of diphenic acid, 24 weight % of propyl-4-hydroxy benzoate, 5 weight % of ethyl cellulose, 2 weight % of castor oil, 10 weight % of rosin gum and 53 weight % of poly-propylene glycol.

* * * * *